United States Patent
Mateosky et al.

(10) Patent No.: US 8,884,649 B1
(45) Date of Patent: Nov. 11, 2014

(54) SYSTEM AND METHOD FOR STATIONARY FINITE IMPULSE RESPONSE FILTERS IN PROGRAMMABLE MICROELECTRONIC CIRCUITS

(71) Applicant: Ciena Corporation, Hanover, MD (US)

(72) Inventors: John P. Mateosky, West River, MD (US); Michael Y. Frankel, Baltimore, MD (US); Vladimir Pelekhaty, Baltimore, MD (US)

(73) Assignee: Ciena Corporation, Hanover, MD (US)

( * ) Notice: Subject to any disclaimer, the term of this patent is extended or adjusted under 35 U.S.C. 154(b) by 16 days.

(21) Appl. No.: 13/868,074

(22) Filed: Apr. 22, 2013

(51) Int. Cl.
G06F 7/38 (2006.01)
H03K 19/173 (2006.01)
H03K 19/003 (2006.01)

(52) U.S. Cl.
CPC ............... *H03K 19/00346* (2013.01)
USPC .................. 326/38; 326/39; 326/41

(58) Field of Classification Search
None
See application file for complete search history.

(56) References Cited

U.S. PATENT DOCUMENTS

| | | | | |
|---|---|---|---|---|
| 6,438,570 B1 * | 8/2002 | Miller | ............ | 708/625 |
| 7,590,676 B1 * | 9/2009 | Langhammer | ............ | 708/319 |
| 7,814,137 B1 * | 10/2010 | Mauer | ............ | 708/300 |
| 8,386,550 B1 * | 2/2013 | Mauer et al. | ............ | 708/301 |

OTHER PUBLICATIONS

Savory, S., "Digital filters for coherent optical receivers," Jan. 21, 2008 / vol. 16, No. 2 / Optics Express p. 804.
Poggiolini, P. et al.,"Evaluation of the computational effort for chromatic dispersion compensation in coherent optical PM-OFDM and PM-QAM systems," Feb. 2, 2009 / vol. 17, No. 3 / Optics Express p. 1385.
Leibrich, J. et al., "Frequency Domain Equalization with Minimum Complexity in Coherent Optical Transmission Systems," OFC/NFOEC 2010, paper OWV1.pdf.
Goldfarb, G. et al., "Chromatic Dispersion Compensatin Using Digital IIR Filtering With Coherent Detection," IEEE Photonics Technology Letters, vol. 19, No. 13, Jul. 1, 2007, p. 969.
Taylor, M., "Compact Digital Dispersion Compensation Algorithms," OFC/NFOEC 2008, paper OTuO1.pdf.
Akopian, D. et al., "Fast-matched filters in time domain for global positioning system receivers," IEE Proc.-Radar Sonar Navig., vol. 153, No. 6, Dec. 2006, p. 525-531.

* cited by examiner

*Primary Examiner* — Anh Tran
(74) *Attorney, Agent, or Firm* — Muncy, Geissler, Olds & Lowe, P.C.

(57) ABSTRACT

A Field Programmable Gate Array (FPGA) to implement channel equalization to mitigate group velocity dispersion in an optical system. In one embodiment, a mapping is loaded into the FPGA whereby the in-phase and quadrature components of the baseband sequence to be filtered are routed to accumulators to form various sums, where each sum is multiplied by a corresponding distinct filter tap coefficient value according to the mapping to form various products, and where the products are summed to provide the in-phase and quadrature components of the filtered output.

22 Claims, 6 Drawing Sheets

SYSTEM AND METHOD FOR STATIONARY FINITE IMPULSE RESPONSE FILTERS IN PROGRAMMABLE MICROELECTRONIC CIRCUITS

FIELD OF DISCLOSURE

The invention relates to microelectronic circuits, and more particularly to a digital filter implemented in a Field Programmable Gate Array.

BACKGROUND

Signal transmission through many mediums may be subject to dispersion. For example, for electromagnetic propagation through an optical fiber, the index of refraction of the optical fiber may be frequency dependent over the bandwidth of the propagating signal, so that the signal undergoes velocity group dispersion as it propagates along the optical fiber. Dispersion may cause inter-symbol interference, thereby limiting the information rate unless mitigated.

Signal processing techniques may be utilized at the transmitter, receiver, or both to help mitigate the effects of dispersion. One such signal processing technique is to employ a filter at the transmitter or receiver, sometimes referred to as a channel equalizer. One such example for optical communication over fiber is to utilize a digital filter after a received optical signal is down-converted to an electrical signal, where the digital filter is applied to the in-phase and quadrature components of the electrical signal after analog to digital conversion.

It is desirable to perform such signal processing techniques in a cost-effective manner.

SUMMARY

Embodiments of the invention are directed to systems and methods for stationary finite impulse response filters in programmable microelectronic circuits.

An embodiment filters a first input sequence to provide a filtered output, where the embodiment includes a first memory to store a time window of the first input sequence; and a Field Programmable Gate Array (FPGA). The FPGA is programmed with a mapping to implement a filter, where the filter is associated with a set of filter tap coefficients. The set of filter tap coefficients is represented by a set of distinct values, wherein the mapping associates for each distinct value a set of the time window of the first input sequence. The FPGA is programmed to implement a process comprising: summing for each distinct value an associated set of the time window of the first input sequence according to the mapping to provide a first plurality of sums, each sum in the first plurality of sums associated with a distinct value; multiplying each sum in the first plurality of sums with its corresponding distinct value to provide a first plurality of products; and summing each product in the first plurality of products to provide a portion of the filtered output.

Another embodiment filters a first input sequence to provide a filtered output, where the filtering is associated with a set of filter tap coefficients, where the set of filter tap coefficients is represented by a set of distinct values, and where the embodiment comprises: storing a time window of the first input sequence; summing for each distinct value an associated set of the time window of the first input sequence according to a mapping to provide a first plurality of sums, the mapping associating for each distinct value a set of the time window of the first input sequence, each sum in the first plurality of sums associated with a distinct value; multiplying each sum in the first plurality of sums with its corresponding distinct value to provide a first plurality of products; and summing each product in the first plurality of products to provide a portion of the filtered output.

Another embodiment filters a first input sequence to provide a filtered output, where the filter is associated with a set of filter tap coefficients, where the set of filter tap coefficients is represented by a set of distinct values, the embodiment comprising: a means for storing, the means for storing to store a time window of the first input sequence; a first means for summing, the first means for summing to sum for each distinct value an associated set of the time window of the first input sequence according to a mapping to provide a first plurality of sums, the mapping associating for each distinct value a set of the time window of the first input sequence, each sum in the first plurality of sums associated with a distinct value; a means for multiplying, the means for multiplying to multiply each sum in the first plurality of sums with its corresponding distinct value to provide a first plurality of products; and a second means for summing, the second means for summing to sum each product in the first plurality of products to provide a portion of the filtered output.

Another embodiment stores instructions that when executed on a system cause the system to perform a process to filter a first input sequence to provide a filtered output, where the filter is associated with a set of filter tap coefficients, where the set of filter tap coefficients is represented by a set of distinct values, and the process comprises: storing a time window of the first input sequence; summing for each distinct value an associated set of the time window of the first input sequence according to a mapping to provide a first plurality of sums, the mapping associating for each distinct value a set of the time window of the first input sequence, each sum in the first plurality of sums associated with a distinct value; multiplying each sum in the first plurality of sums with its corresponding distinct value to provide a first plurality of products; and summing each product in the first plurality of products to provide a portion of the filtered output.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Embodiments are disclosed in the following description and related drawings. Alternate embodiments may be devised without departing from the scope of the claims. Additionally, well-known elements will not be described in detail or will be omitted so as not to obscure the relevant details of the invention.

The term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. Specific circuits (e.g., application specific integrated circuits (ASICs)), program instructions being executed by one or more processors, or a combination of both, may perform the various actions described herein. Additionally, the sequences of actions described herein can be considered to be embodied entirely within any form of computer-readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 1:
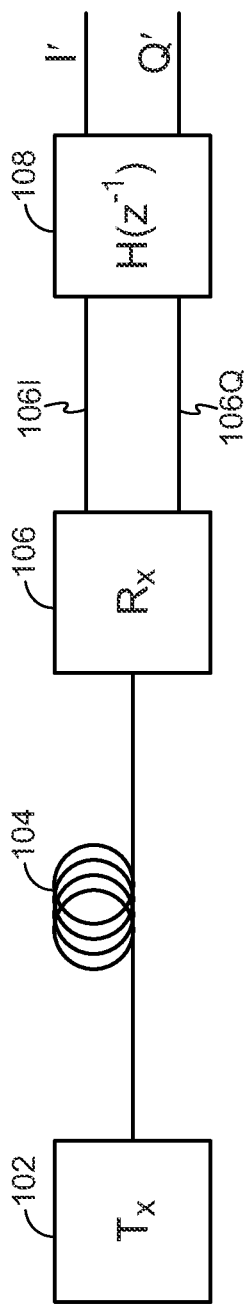
FIG. 1 illustrates an optical communication system in which an embodiment finds application.

FIG. 1 illustrates part of a communication system in which embodiments may find application. In the particular example of FIG. 1, the transmitter 102 excites a propagation mode of the optical fiber 104 to transmit signals to the receiver 106. The receiver 106 down-converts the received optical signals to electrical signals, and coherently demodulates the received electrical signals to provide baseband in-phase and quadrature signal components. For ease of illustration, it is assumed that the receiver 106 includes bit synchronization and analog-to-digital conversion, so that the in-phase and quadrature signal components provided by the output ports 106I and 106Q are each a sequence of quantized samples, that is, a digital signal.

The transmitter 102 and the receiver 106 each comprise a number of functional components, but for simplicity each are shown as a single functional unit in FIG. 1. Furthermore, for ease of illustration, various optical network components are not shown in FIG. 1, such as for example optical couplers, amplifiers, switches, and so forth.

The signals propagating along the optical fiber 102 are affected by group velocity dispersion. To mitigate the effects of the dispersion, a filter 108 performs channel equalization by filtering the in-phase and quadrature signal components provided by the receiver 106. For some embodiments, the filter 108 may be used at the transmitter 102. The output of the filter 108, denoted as I' and Q' in FIG. 1, are digital signals for which it is intended that the group velocity dispersion introduced by the optical fiber 104 is mitigated as much as practical. In practice, further processing on the I' and Q' digital signals are performed, such as frame synchronization, symbol detection, and decoding for error correction, but for ease of illustration these additional signal processing components are not indicated in FIG. 1 because their description is not needed to disclose the embodiments.

Embodiments are not limited to applications in which the communication medium is an optical fiber, so that embodiments may be of utility for other types of communication systems for which channel equalization may be needed or desired.

Traditionally, it is common to implement the filter 108 in the frequency domain. In this approach, as is well known, a fast Fourier transform (FFT) is performed on the digital signals provided by the receiver 106, the Fourier coefficients are then multiplied by weights representing the Fourier transform of the filter response of the filter 108, and an inverse Fourier fast transform (IFFT) is performed on these weighted coefficients to provide the filtered outputs I' and Q'. As is well known, various other techniques may be employed to implement filtering in the frequency domain, such as the overlap-and-add method, and padding the input sequences so that the time-domain circular convolution on the padded sequences effectuated by the multiplication in the frequency domain implements linear convolution on the original input sequences.

These patent letters disclose that for the communication channels associated with long-haul optical fibers currently in use, the channel equalization performed by the filter 108 may be implemented efficiently and in a cost-effective manner by performing the filtering in the time domain. It is found that good results may be obtained in which the filter 108 is realized by a finite impulse response (FIR) filter having somewhere in the range of 200 to 400 tap coefficients, and more specifically in the range of approximately 200 tap coefficients, assuming a signal of around 30 Gbaud propagating over approximately 2000 km of standard single-mode fiber. Furthermore, it is found that good results may be obtained with integer arithmetic in which a relatively few number of bits are used to represent the filter tap coefficients.

In particular, it is found that good results may be obtained with an embodiment filter for which the tap coefficients are represented by 5-bit signed integers, where one of the 5 bits for an integer represents a sign. Just as importantly, it is found that such time domain filtering may be implemented by presently available, off-the-shelf Field Programmable Gate Arrays (FPGAs).

However, embodiments are not limited to the above examples regarding the number of filter tap coefficients or the representation of the filter tap coefficient values.

By representing the filter tap coefficients as m-bit signed integers, the total number of distinct values for the filter tap coefficients can be much less than the number of tap coefficients. The samples representing the in-phase and quadrature sequences to be filtered need not necessarily be represented by the same number of bits as that used to represent the filter tap coefficients.

First consider the case in which the filter tap coefficients are real-valued.

Without loss of generality, a filter may be scaled such that each filter tap coefficient can be represented by a signed integer taken from the set $I=\{-K, -(K-1), \ldots, -2, -1, 1, 2, \ldots, (K-1), K\}$.

We assume that I is the smallest such set that covers all values of the filter tap coefficients. It may happen that not all integers in the set I are needed to represent the filter tap coefficients, but the resulting formalism takes care of that. Without loss of generality, $K=2^{m-1}-1$ so that m bits may be used to represent each integer in the set I.

Consider applying a FIR filter h with N taps to a real-valued input sequence x, which may be an in-phase or quadrature component of a demodulated sequence. Let y denote the filtered output sequence. The filtered output sequence y is y=h*x, where * denotes the convolution operator. The value of y at the time index t, denoted as y [t], is represented by y[t]=h*x(t), where h*x(t) denotes that the convolution is evaluated at time index t. That is, in component form, $y(t)=\Sigma_i h(i) x[t-i]$, where h(i) are the filter tap coefficients or impulse response of the channel equalization filter h, and x[j] is the value of the input sequence x at time index j.

The index i in the expression $\Sigma_i h(i)x[t-i]$ ranges over a suitable index set for describing the filter taps. For example, for a causal filter, $y(t)=\Sigma_{i=0}^{N-1} h(i)x[t-i]$, where h(i), i=0, 1, . . . , N−1 are the filter taps. However, by accepting an overall latency in output, non-causal filters may be employed. Accordingly, we do not include a specific index set when considering the sum $\Sigma_i h(i)x[t-i]$ as well as similar sums considered later.

Let M(k) denote the set of all values of the index j for which h(j)=k. That is, M(k) names all those filter taps that are represented by the m-bit signed integer k. Note that M(k) is the set of all values for the index j for which x[t−j] is multiplied by the value k to evaluate the filtered output y[t]. That is, M(k) names all the input samples that are multiplied by the same value of a filter tap coefficient when evaluating the filtered output. There are 2K such sets, and the family of sets {M(−K), . . . , M(−1), M(1), . . . , M(K)} defines a mapping $M_R$.

At each time index t for which the filtered output y[t] is desired, embodiments first evaluate the sums $s(t, k)=\Sigma_{i \in M(k)} x[t-i]$ for k=−K, . . . −1, 1, . . . , K. That is, all the input samples that are to be multiplied by the same distinct value of a filter tap coefficient are summed. The filtered output is then given by $y[t]=\Sigma_k k s(t, k)$. The range for the index k is over the index set I. That is, each sum is multiplied by a corresponding filter tap coefficient value, and these products are summed to evaluate the filtered output.

If the above expression is generalized to a complex-valued input sequence, then y[t] may be complex-valued. Its real (in-phase) part, $y_I(t)$, is given by $y_I(t)=\Sigma_k k \text{Re}\{s(t, k)\}$, and its imaginary (quadrature) part, $y_Q(t)$, is given by $y_Q(t)=\Sigma_k k \text{Im}\{s(t, k)\}$, where Re{•} and Im{•} denote, respectively, the real part and imaginary parts of their respective arguments.

The above description for a real-valued filter is readily generalized to the case in which the filter tap coefficients are complex-valued. For this more general case, each filter tap coefficient h(i) may be represented as $h(i)=(h_I(i), h_Q(i))$, where $h_I(i)$ and $h_Q(i)$ are the real and imaginary parts, respectively, of h(i). Similarly, the input sequence is $x[t]=(x_I[t], x_Q[t])$, where $x_I[t]$ and $x_Q[t]$ are the real (in-phase) and imaginary (quadrature) parts, respectively, of x[i]; and the filtered output sequence is $y[t]=(y_I[t], y_Q[t])$, where $y_I[t]$ and $y_Q[t]$ are the real and imaginary parts, respectively, of y[t].

Let the set I represent the distinct non-zero values of the tap coefficients $h_I(i)$ and $h_Q(i)$ where i=0, 1, . . . , N−1. Let $M_I(k)$ denote the set of all values of the index j for which $h_I(j)=k$. That is, $$M_I(k)=\{j:h_I(j)=k\}.$$

Let $M_Q(k)$ denote the set of all values of the index j for which $h_Q(j)=k$. That is, $$M_Q(k)=\{j:h_Q(j)=k\}.$$

In other words, $M_I(k)$ names all filter taps with the tap coefficients' real part represented by the m-bit integer k; and $M_Q(k)$ names all filter taps with the tap coefficients' imaginary part represented by the m-bit integer k.

The family of sets $\{M_I(k), k=-K, \ldots, -1, 1, \ldots, K\}$ defines a mapping $M_I$, and the family of sets $\{M_Q(k), k=-K, \ldots, -1, 1, \ldots, K\}$ defines a mapping $M_Q$. The pair of mappings $M_I$ and $M_Q$ may sometimes be referred to as a single mapping M. For the mapping M, at each time index t for which the filtered output y[t] is desired, embodiments evaluate the following sums for k=−K, . . . , −1, 1, . . . , K:

$$s_{II}(t,k)=\Sigma_{i \in M_I(k)} x_I[t-i],$$

$$s_{QQ}(t,k)=\Sigma_{i \in M_Q(-k)} x_Q[t-i],$$

$$s_{IQ}(t,k)=\Sigma_{i \in M_I(k)} x_Q[t-i],$$

$$s_{QI}(t,k)=\Sigma_{i \in M_Q(k)} x_I[t-i].$$

Note the argument −k in the mapping for the definition of the sum $s_{QQ}(t, k)$. Because the filtered outputs $y_I[t]$ and $y_Q[t]$ are $$y_I[t]=\Sigma_i h_I(i)x_I(t-i)-\Sigma_i h_Q(i)x_Q(t-i),$$

$$y_Q[t]=\Sigma_i h_I(i)x_Q(t-i)+\Sigma_i h_Q(i)x_I(t-i),$$

it follows that the in-phase component and the quadrature components of the filtered output may be written as $$y_I[t]=\Sigma_k k[s_{II}(t,k)+s_{QQ}(t,k)],$$

$$y_Q[t]=\Sigma_k k[s_{IQ}(t,k)+s_{QI}(t,k)].$$

Evaluating the in-phase component of the filtered output may be summarized as follows: For each distinct filter tap coefficient value there corresponds a sum of all the in-phase and quadrature components of the input sequence that are to be multiplied by that distinct filter tap coefficient value. Evaluate each such sum corresponding to each distinct filter tap coefficient value, and multiply each such sum by its corresponding distinct filter tap coefficient value to generate a product. Sum all such products to provide the in-phase component of the filtered output.

Similarly, evaluating the quadrature component of the filtered output may be summarized as follows: For each distinct filter tap coefficient value there corresponds a sum of all the in-phase and quadrature components of the input sequence that are to be multiplied by that distinct filter tap coefficient value. Evaluate each such sum corresponding to each distinct filter tap coefficient value, and multiply each such sum by its corresponding distinct filter tap coefficient value to generate a product. Sum all such products to provide the quadrature component of the filtered output.

The filter 108 is encapsulated in the mapping M and in the manner in which the above sums are multiplied by their respective filter tap coefficient value. This mapping may be realized by configuring routing in a FPGA. The number of bits used to represent the filter tap coefficients, or equivalently the number of distinct filter tap coefficient values, determines the mapping complexity and the number of multiplications. The tap positions of the various distinct values that represent the filter tap coefficients determine the particular routing. The filter order (number of filter tap coefficients) determines the size of the memory needed to store a time window of the input sequence.

Figure 2:
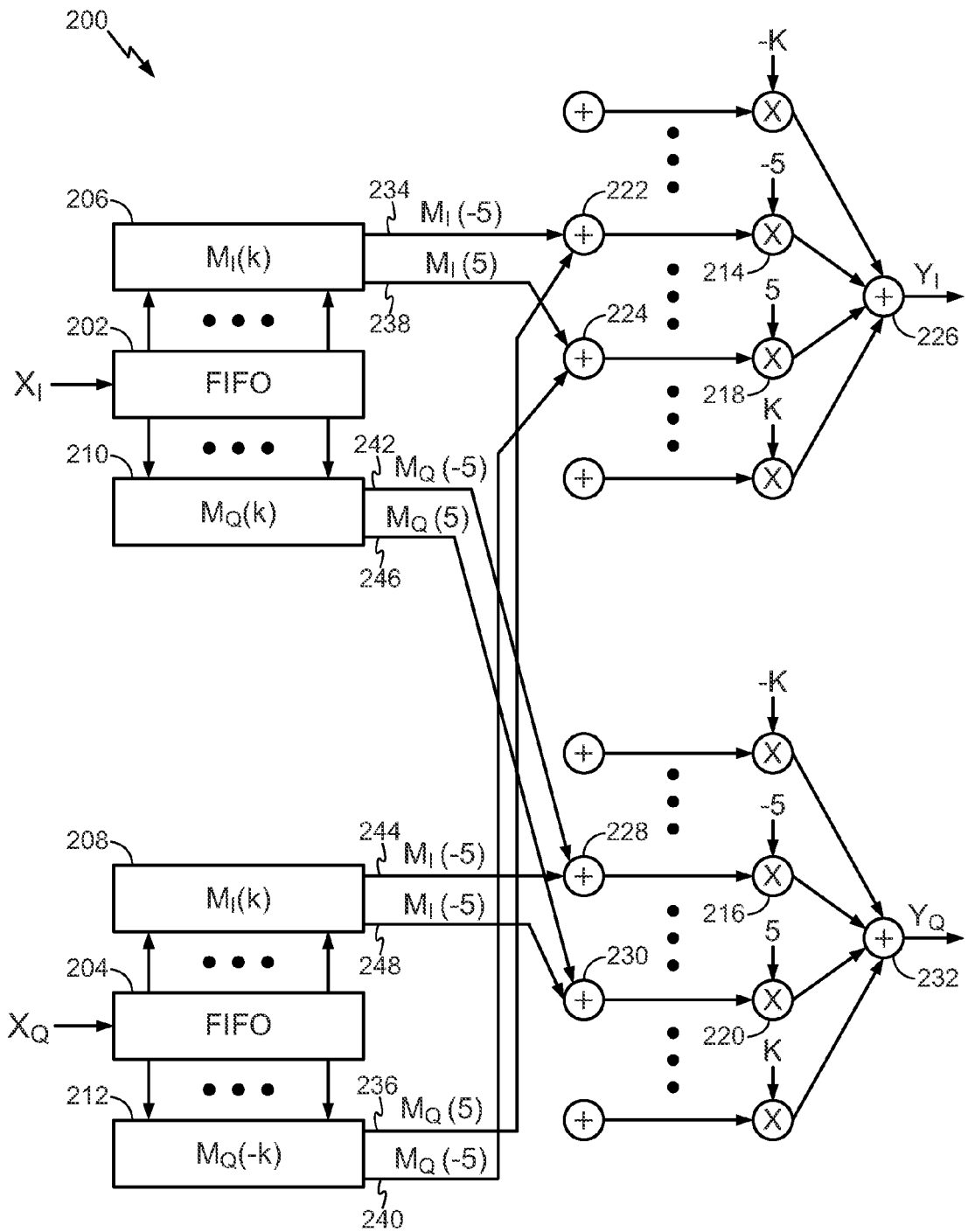
FIG. 2 illustrates an apparatus according to an embodiment.

FIG. 2 illustrates an FPGA 200 according to an embodiment. The components shown in FIG. 2 represents a high-level abstraction of programmed elements within the FPGA 200. The in-phase and quadrature components of the input sequence over the length of the filter window are stored in the FIFO (First-In-First-Out) memories 202 and 204. That is, for a FIR filter h with N tap coefficients, the FIFO memories 202 and 204 each store N values of their respective input sequences. The FIFO memories 202 and 204 may be implemented outside the FPGA 200 if there is insufficient memory.

The FPGA 200 is programmed to route the in-phase and quadrature components of the input sequence stored in the FIFO memories 202 and 204 according to the mappings described previously. The functional units 206 and 208 represent the $M_I$ mapping, and the functional units 210 and 212 represent the $M_Q$ mapping.

Note the functional unit 212 is labeled in FIG. 2 with the mapping $M_Q(-k)$. This indicates the routing implied by the expression $s_{QQ}(t, k) = \Sigma_{i \in M_Q(-k)} x_Q[t-i]$.

For ease of illustration, not all signal paths are shown in FIG. 2, and only the signal paths associated with the filter tap coefficient values of 5 and −5 are shown. This is sufficient for describing the embodiments. Specifically, the multipliers for the filter tap coefficient with integer value −5 are labeled 214 and 216, and the multipliers for the filter tap coefficient with integer value 5 are labeled 218 and 220. The signal path for $x_I[t-i]$ where $i \in M_I(-5)$, labeled as 234, and the signal path for $x_Q[t-i]$ where $i \in M_Q(5)$, labeled as 236, are routed to the accumulator 222, where the output of the accumulator 222 is provided to the multiplier 214 for multiplication by −5. The signal path for $x_I[t-i]$ where $i \in M_I(5)$, labeled as 238, and the signal path for $x_Q[t-i]$ where $i \in M_Q(-5)$, labeled as 240, are routed to the accumulator 224, where the output of the accumulator 224 is provided to the multiplier 218 for multiplication by 5. The output of the multipliers 214 and 218 are provided to the summer 226 to contribute to the in-phase component of the filtered output.

The signal path for $x_I[t-i]$ where $i \in M_Q(-5)$, labeled as 242, and the signal path for $x_Q[t-i]$ where $i \in M_I(-5)$, labeled as 244, are routed to the accumulator 228, where the output of the accumulator 228 is provided to the multiplier 216 for multiplication by −5. The signal path for $x_I[t-i]$ where $i \in M_Q(5)$, labeled as 246, and the signal path for $x_Q[t-i]$ where $i \in M_I(5)$, labeled as 248, are routed to the accumulator 230, where the output of the accumulator 230 is provided to the multiplier 220 for multiplication by 5. The output of the multipliers 216 and 220 are provided to the summer 232 to contribute to the quadrature component of the filtered output.

The previous expressions for the filtered output may be written as $$y_I[t] = \Sigma_{k=1}^{K} k[s_{II}(t,k) + s_{QQ}(t,k) - s_{II}(t,-k) - s_{QQ}(t,-k)],$$

$$y_Q[t] = \Sigma_{k=1}^{K} k[s_{IQ}(t,k) + s_{QI}(t,k) - s_{IQ}(t,-k) - s_{QI}(t,-k)].$$

The above expressions lead to an embodiment where the set of integers {1, 2, . . . , K} is used to represent the distinct values of the filter tap coefficients, so that half as many integer multipliers are used when compared to the previous embodiments, although sign inversions are used.

For example, the embodiment of FIG. 2 may be modified to an embodiment employing half as many distinct values for the filter tap coefficients by using only positive integers to represent the filter tap coefficients, where the negative values are taken care of by inverting the sign of the signal paths that in FIG. 2 couple to the negative multipliers.

Figure 3:
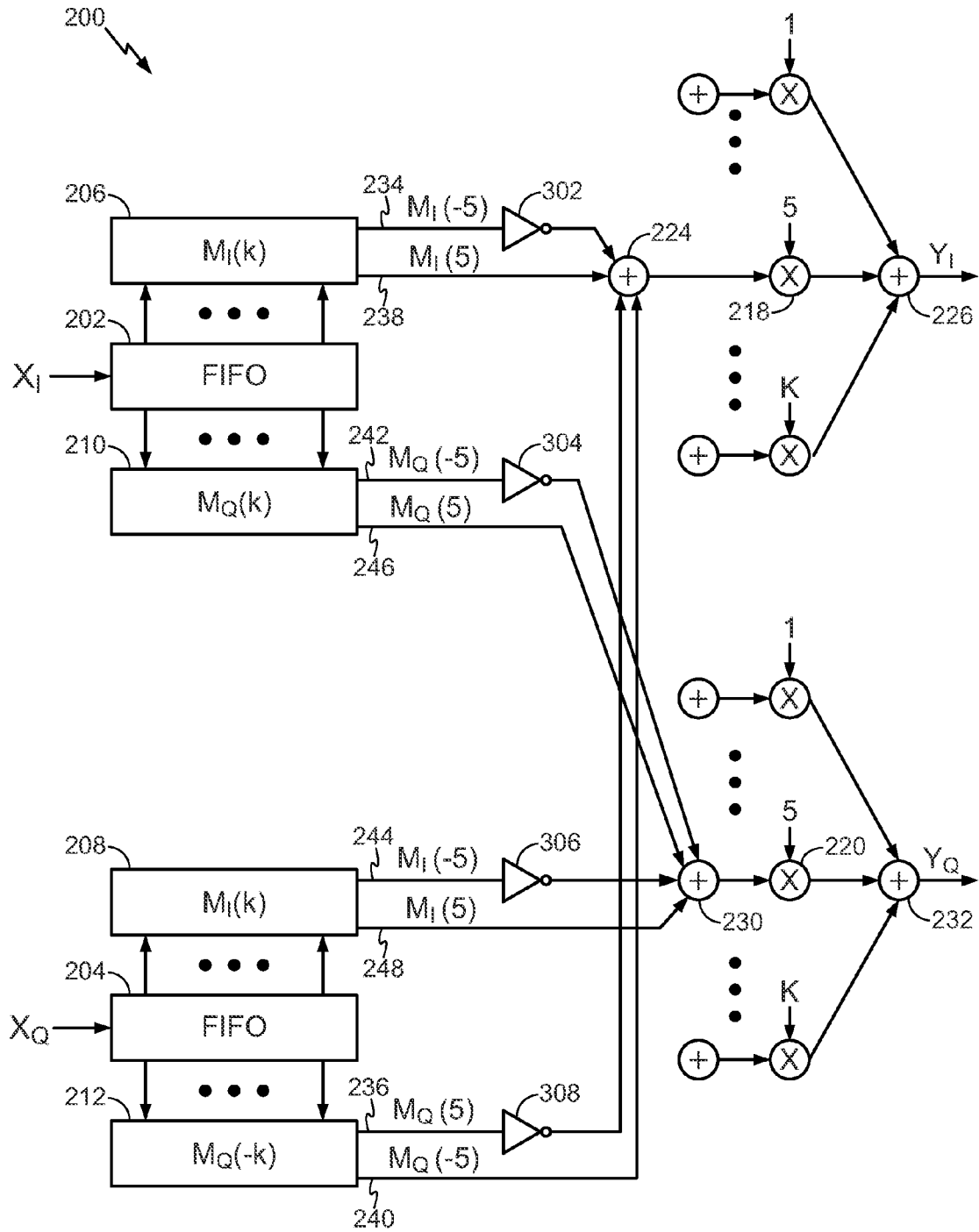
FIG. 3 illustrates an apparatus according to another embodiment.

A specific example is illustrated in FIG. 3. FIG. 3 is similar to FIG. 2 and illustrates an embodiment with half the number of distinct values for representing the filter tap coefficients compared to that of FIG. 2. Equivalent or similar functional units in FIG. 2 and FIG. 3 share the same labels. However, inverter functional units 302, 304, 306, and 308 are introduced in FIG. 3 to invert the sign of those sequences on signal paths that are multiplied by −5 in FIG. 2.

Other embodiments may be realized by employing different methods of multiplication. For example, it is well known that multiplication of two complex numbers may be realized with four real multiplies and two additions. In another embodiment, complex multiplication may be realized with four additions and three multiplications. Other techniques may perform multiplication by using bit shifters for multiplies of powers of two, where various filter tap coefficient values may be represented as sums of powers of two.

Embodiments may take advantage of parallel processing to increase throughput. For example, the mapping and routing described in FIG. 2 may be replicated multiple times in the FPGA 200, as well as the accumulative adders, the multipliers, and the summers. Each replica operates on a shifted window of the input sequence. The output of the FIFO memories may be multiplexed to replicated programmable mapping functional units. As each new in-phase sample and quadrature sample enters their respective FIFO memory, representing a new shifted time window of the input sequence, the stored samples in the FIFO memories are routed by an available instance of the replicated programmable mapping functional unit to their corresponding accumulative adders, multipliers, and summers, so that the in-phase and quadrature components of the filtered output for that particular time window may be provided.

Regardless of which particular mapping implementation is chosen, a database may be constructed whereby channel equalization filters for a plurality of network configurations are analyzed. For example, a configuration may comprise the accumulated group velocity dispersion of the optical fiber linking a transmitter to a receiver, and the signal baud. For this particular example, the optimum channel equalization filters for a range of optical fiber lengths may be determined for some given word-length representing the filter tap coefficient values. For each such optimum channel equalization filter, a corresponding FPGA bit file may be determined to implement the mapping and routing as described previously. An operator may load the appropriate bit file to the FPGA depending upon the particular network configuration.

Figure 4:
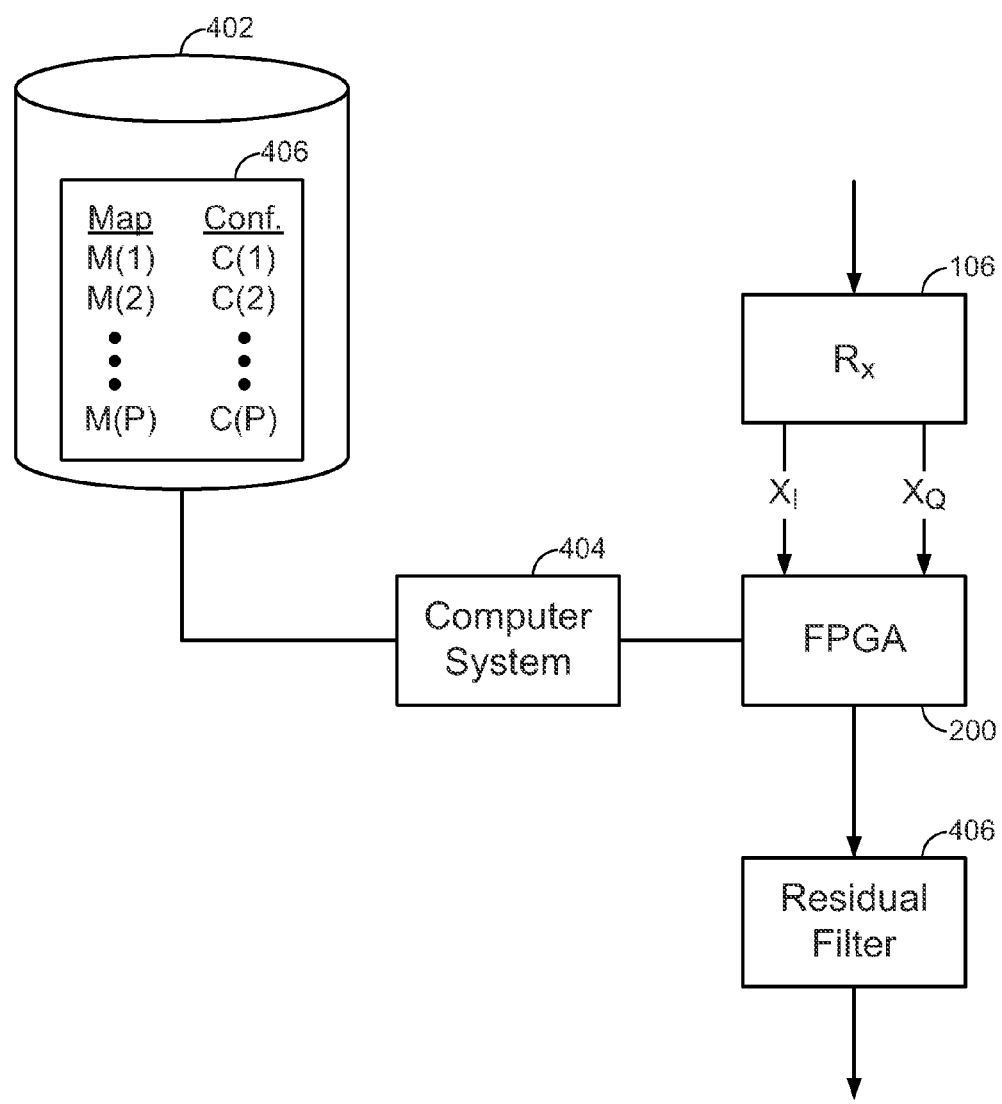
FIG. 4 illustrates a system according to an embodiment.

For example, in the embodiment illustrated in FIG. 4, in a memory 402 is stored a table 406. Each entry in the table 406 includes a configuration C(i) and a corresponding bit file M(i), where for simplicity three such entries are shown, a first entry for the pair of bit file and configuration M(1) and C(1), a second entry for the pair M2 and C(2), and a last entry for the pair M(P) and C(P).

The memory 402 may represent a memory hierarchy, comprising different levels of memory available to the computer system 404. An operator uses the computer system 404 to load the appropriate FPGA bit file to the FPGA 200, depending upon the configuration in the table 406 that most closely represents the current network configuration. The loaded bit file programs the FPGA 200 to perform the appropriate mapping, thereby performing the appropriate channel equalization on the in-phase and quadrature components of the baseband samples provided by the receiver 106.

The bit files are stored in a non-transitory, computer-readable medium, such as a memory represented by the memory 402.

The particular configurations stored in the table 406 may not exactly match the particular configuration of the network. Furthermore, the channel equalization filters computed ahead of time and stored in the table 406 for the various configurations will in practice be based upon a model of the optical fiber that may not exactly represent the current state of the propagation characteristics of the optical fiber at the time for which equalization is desired. For example, the optical fiber will age over time, and accordingly the propagation characteristics will change over time. As a result, it may be desirable to perform additional filtering, as represented by the residual filter 406.

The residual filer 406 may be adaptive. For example, when a known training sequence is transmitted, the filter response of the residual filter 406 may be adjusted, for example according to a least-means-square algorithm. However, because it is expected that the filter implemented by the FPGA 200 will do a fairly good job of mitigating the effects of group velocity dispersion and other factors that contribute to inter-symbol interference, the complexity of the residual filter 406 will be significantly reduced than if the FPGA 200 was not present.

Figure 5:
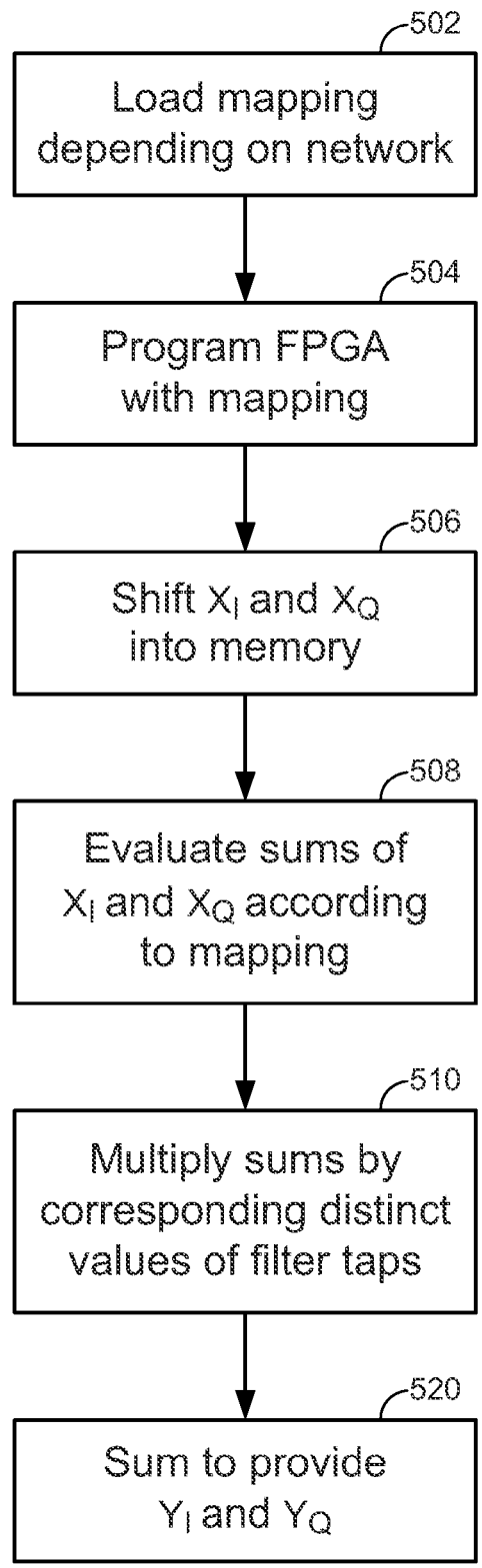
FIG. 5 illustrates a method according to an embodiment.

FIG. 5 is a flow diagram illustrating a method according to an embodiment. In step 502, a mapping is loaded into the FPGA 200, depending upon the network configuration, and in step 504 the FPGA 200 is programmed according to the mapping. In step 506, the in-phase and quadrature components of the input sequence are shifted or loaded into the memory, and in step 508 various accumulative sums of the in-phase and quadrature components of the input sequence over the filter window are evaluated according to the loaded mapping, as previously described. Step 510 indicates that these accumulative sums are multiplied by corresponding distinct filter tap coefficient values, and step 520 indicates that the results of these products are summed to provide the in-phase and quadrature components of the filtered output, as described in detail previously.

Presently, the conventional approach for mitigating group velocity dispersion in a high performance optical network, from about 40 Gbps to 400 Gbps, is to implement a channel equalization filter in custom or semi-custom ASIC (Application Specific Integrated Circuit) technology. The embodiments disclosed herein achieve the same level of performance as ASIC technology, but with off-the-shelf SRAM-based (Static Random Access Memory) FPGAs. There is thus a significant reduction in development cost, without a loss in performance. Furthermore, by pre-computing the mappings stored in the table 406, the FPGAs may be easily and quickly loaded with a mapping optimized (or approximately optimized) for a particular network configuration.

Figure 6:
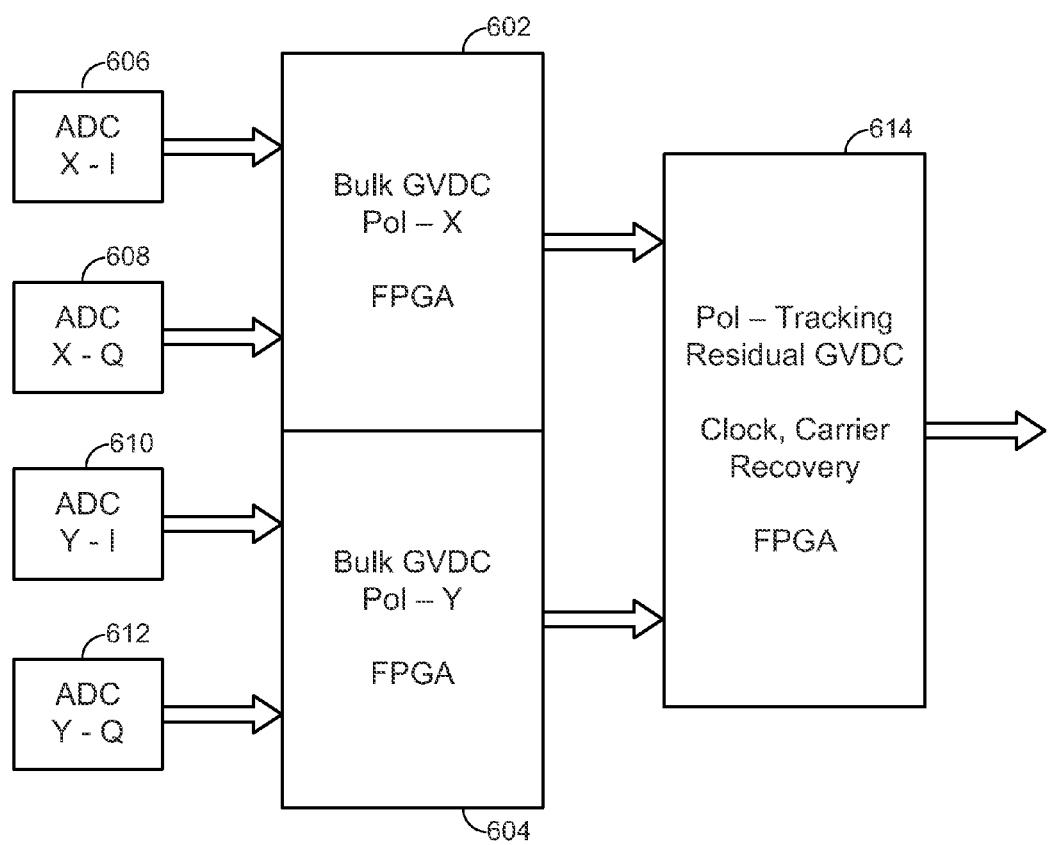
FIG. 6 illustrates an apparatus according to an embodiment.

The number of FPGAs used in an embodiment depends upon the capability and performance presently available in FPGA technology. FIG. 6 illustrates a coherent receiver according to an embodiment, where functional blocks 602 and 604 may together represent one or more FPGAs. In the particular embodiment of FIG. 6, for ease of discussion each of functional blocks 602 and 604 will be referred to as an FPGA.

The functional blocks 606, 608, 610, and 612 each represent an ADC (Analog-to-Digital Converter). The ADC 606 and the ADC 608 provide streams of digital data representing the in-phase and quadrature components, respectively, of the x-polarization of the received optical signal; and the ADC 610 and the ADC 612 provide streams of digital data representing the in-phase and quadrature components, respectively, of the y-polarization of the receive optical signal.

Each FPGA 602 and 604 provides bulk group velocity dispersion correction (GVDC) for their respective polarization. A typical input stream for each functional unit 602 and 604 may be 160 GB/s for each in-phase and quadrature data stream. The FPGAs 602 and 604 are programmed with a mapping and routing as described previously, where the mapping and routing encapsulates the particular filter chosen for the network configuration for which channel equalization (GVDC) is desired.

The FPGA 614 in FIG. 6 implements a residual filter, such as the residual filter 406 discussed previously. As indicated in FIG. 6, the FPGA 614 performs residual GVDC, polarization tracking, and clock and carrier recovery. Not shown is additional signal processing applied to the output stream of the FPGA 614, such as for example forward error correction and framing.

The FPGAs 602 and 604 perform the bulk of the GVDC, as implied by the labeling in FIG. 6. Because the mappings loaded into the FPGAs 602 and 604 may, in general, not be perfectly optimized for the particular characteristics of the optical channel at hand, it may be desirable to perform additional filtering on the output streams of the FPGAs 602 and 604, as discussed previously with respect to the residual filter 406. Because the FPGAs 602 and 604 are expected to perform the bulk of the GVDC, the burden placed on the residual filter is relatively small in the sense that only a relatively small number of filter tap coefficients, or the equivalent thereof, may be sufficient. As a result, a FPGA may be sufficiently up to task to perform the residual filtering, where such residual filtering may be adaptive with a relatively high computational load per filter tap.

Performing time domain filtering according to an embodiment has been found to consume less FPGA resources than implementing a traditional approach in the frequency domain by way of the FFT. Furthermore, the number of filter tap coefficients may be significantly reduced compared to the number recommended by traditional design guidelines or rules of thumb. For example, for a NDSF (Non-Dispersion Shifted Fiber) fiber plant with a propagation distance of 2000 Km, and a sampling interval of 25 ps for a data rate of 40 GS/s, a conventional rule of thumb for GVDC indicates a minimum tap count of 435 for this 100G signaling example. However, the tap count may be cut in half by a design procedure in which the filter tap number is gradually reduced and the filter tap coefficient values are adjusted for a maximum eye Q-factor. The optimization may be performed based upon a LSM (Least Squares Minimum) approach using a simplex-based method of nonlinear, unconstrained function minimization, such as the Nelder-Mead method (J. A. Nelder and R. Mean, "A Simplex Method for Function Minimization," Computer Journal 7 (1965), 308-313.).

A summary of FPGA resource utilization for an embodiment with comparisons to a traditional approach is provided in Table 1. The particular resource utilization provided in Table 1 is for a Xilinx Virtex®-7 1140T FPGA implemented in 28 nm process technology. (Virtex is a registered trademark of Xilinx.) Resource utilization comparisons are made among embodiments with and without LMS optimization, and are compared to a traditional approach in the frequency domain utilizing an FFT. As can be seen from Table 1, embodiments provide significant reduction in resource utilization when compared to a traditional approach.

TABLE 1

28 nm FPGA Resource Summary for a 2000 km GVDC Complex Filter Implementation of a 100 G, DP-QPSK signal (single polarization resources only).

| | Filter Implementation Details | | | |
|---|---|---|---|---|
| Specific FPGA Resources | Frequency Domain, Typical Implementation | Time-Domain, 5-bit signed No LMS opt. | Time-Domain, 5-bit signed sample, LMS opt. | Time-Domain, 4-bit signed sample, LMS opt. (Best Case) |
| Taps | 435 | 435 | 217 | 217 |
| DSP48 Hard Macros | 2.8K (84%) | 0 | 0 | 0 |
| LUTs | 320K (45%) | 206K (29%) | 204K (29%) | 190K (27%) |

TABLE 1-continued 28 nm FPGA Resource Summary for a 2000 km GVDC Complex Filter Implementation of a 100 G, DP-QPSK signal (single polarization resources only).

| Specific FPGA Resources | Filter Implementation Details | | | |
|---|---|---|---|---|
| | Frequency Domain, Typical Implementation | Time-Domain, 5-bit signed No LMS opt. | Time-Domain, 5-bit signed sample, LMS opt. | Time-Domain, 4-bit signed sample, LMS opt. (Best Case) |
| Flip-Flops | 285K (20%) | 162K (12%) | 160K (11%) | 142K (10%) |
| Memory (bits) | 1.0M | 0.7M | 1.45M | 0.7M |
| SERDES (11 G) | 32 (33%) | 32 (33%) | 32 (33%) | 32 (33%) |

The embodiments have been described with respect to implementing an FIR filter. However, with feedback from the filtered output, infinite impulse response (IIR) filtering may be implemented in which one or more instances of a described embodiment may perform part or all of the IIR filtering.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer-readable media embodying a method for implementing a stationary finite impulse response filters in programmable microelectronic circuits. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. An apparatus to filter a first input sequence to provide a filtered output, the apparatus comprising:
   a first memory to store a time window of the first input sequence; and
   a Field Programmable Gate Array (FPGA) programmed with a mapping to implement a filter, the filter associated with a set of filter tap coefficients, where the set of filter tap coefficients is represented by a set of distinct values, wherein the mapping associates for each distinct value a set of the time window of the first input sequence,
   the FPGA programmed to implement a process comprising:
      summing for each distinct value an associated set of the time window of the first input sequence according to the mapping to provide a first plurality of sums, each sum in the first plurality of sums associated with a distinct value;
      multiplying each sum in the first plurality of sums with its corresponding distinct value to provide a first plurality of products; and
      summing each product in the first plurality of products to provide a portion of the filtered output.

2. The apparatus of claim 1, wherein the summing for each distinct value an associated set of the time window of the first input sequence includes sign inverting a subset of the associated set of the time window of the first input sequence.

3. The apparatus of claim 1, the filter to filter a second input sequence to provide the filtered output, wherein the first input sequence and the second input sequence comprise, respectively, in-phase and quadrature components of an input sequence, the filtered output comprising in-phase and quadrature components, wherein the summing each product in the first plurality of products provides the in-phase component of the filtered output, the apparatus further comprising:
   a second memory to store a time window of the second input sequence, wherein the mapping associates for each distinct value a set of the time window of the second input sequence;
   the process implemented by the FPGA further comprising:
      summing for each distinct value an associated set of the time window of the second input sequence according to the mapping to provide a second plurality of sums, each sum in the second plurality of sums associated with a distinct value;
      multiplying each sum in the second plurality of sums with its corresponding distinct value to provide a second plurality of products; and
      summing each product in the second plurality of products to provide the quadrature component of the filtered output.

4. The apparatus of claim 3, wherein
   the summing for each distinct value an associated set of the time window of the first input sequence includes sign inverting a subset of the associated set of the time window of the first input sequence; and
   the summing for each distinct value an associated set of the time window of the second input sequence includes sign inverting a subset of the associated set of the time window of the second input sequence.

5. The apparatus of claim 3, wherein
the first memory comprises a first First-In-First-Out (FIFO) memory to store the time window of the first input sequence; and
the second memory comprises a second FIFO memory to store the time window of the second the input sequence.

6. The apparatus of claim 3, further comprising:
a receiver to down-convert and demodulate an optical signal to provide the first and second input sequences.

7. A method to filter a first input sequence to provide a filtered output, the filtering associated with a set of filter tap coefficients, where the set of filter tap coefficients is represented by a set of distinct values, the method comprising:
storing a time window of the first input sequence;
summing for each distinct value an associated set of the time window of the first input sequence according to a mapping to provide a first plurality of sums, the mapping associating for each distinct value a set of the time window of the first input sequence, each sum in the first plurality of sums associated with a distinct value;
multiplying each sum in the first plurality of sums with its corresponding distinct value to provide a first plurality of products; and
summing each product in the first plurality of products to provide a portion of the filtered output.

8. The method of claim 7, wherein the summing for each distinct value an associated set of the time window of the first input sequence includes sign inverting a subset of the associated set of the time window of the first input sequence.

9. The method of claim 7, wherein the first input sequence and a second input sequence comprise, respectively, in-phase and quadrature components of an input sequence, the filtered output comprising in-phase and quadrature components, wherein the summing each product in the first plurality of products provides the in-phase component of the filtered output, the method further comprising:
storing a time window of the second input sequence, wherein the mapping associates for each distinct value a set of the time window of the second input sequence;
summing for each distinct value an associated set of the time window of the second input sequence according to the mapping to provide a second plurality of sums, each sum in the second plurality of sums associated with a distinct value;
multiplying each sum in the second plurality of sums with its corresponding distinct value to provide a second plurality of products; and
summing each product in the second plurality of products to provide the quadrature component of the filtered output.

10. The method of claim 9, wherein
the summing for each distinct value an associated set of the time window of the first input sequence includes sign inverting a subset of the associated set of the time window of the first input sequence; and
the summing for each distinct value an associated set of the time window of the second input sequence includes sign inverting a subset of the associated set of the time window of the second input sequence.

11. The method of claim 9, wherein
storing the time window of the first input sequence comprises storing the time window of the first input sequence in a first First-In-First-Out (FIFO) memory; and
storing the time window of the second input sequence comprises storing the time window of the second input sequence in a second FIFO memory.

12. The method of claim 9, further comprising:
down-converting and demodulating an optical signal to provide the first and second input sequences.

13. An apparatus to filter a first input sequence to provide a filtered output, the filter associated with a set of filter tap coefficients, where the set of filter tap coefficients is represented by a set of distinct values, the apparatus comprising:
a means for storing, the means for storing to store a time window of the first input sequence;
a first means for summing, the first means for summing to sum for each distinct value an associated set of the time window of the first input sequence according to a mapping to provide a first plurality of sums, the mapping associating for each distinct value a set of the time window of the first input sequence, each sum in the first plurality of sums associated with a distinct value;
a means for multiplying, the means for multiplying to multiply each sum in the first plurality of sums with its corresponding distinct value to provide a first plurality of products; and
a second means for summing, the second means for summing to sum each product in the first plurality of products to provide a portion of the filtered output.

14. The apparatus of claim 13, wherein the first means for summing includes sign inverting a subset of the associated set of the time window of the first input sequence.

15. The apparatus of claim 13, wherein the first input sequence and a second input sequence comprise, respectively, in-phase and quadrature components of an input sequence, the filtered output comprising in-phase and quadrature components, wherein the second means for summing provides the in-phase component of the filtered output, wherein
the means for storing stores a time window of the second input sequence, wherein the mapping associates for each distinct value a set of the time window of the second input sequence;
the first means for summing to sum for each distinct value an associated set of the time window of the second input sequence according to the mapping to provide a second plurality of sums, each sum in the second plurality of sums associated with a distinct value;
the means for multiplying to multiply each sum in the second plurality of sums with its corresponding distinct value to provide a second plurality of products; and
the second means for summing to sum each product in the second plurality of products to provide the quadrature component of the filtered output.

16. The apparatus of claim 15, wherein
the first means for summing includes sign inverting a subset of the associated set of the time window of the first input sequence, and includes sign inverting a subset of the associated set of the time window of the second input sequence.

17. The apparatus of claim 15, wherein
the means for storing comprises a first First-In-First-Out (FIFO) memory to store the time window of the first input sequence, and a second FIFO memory to store the time window of the second input sequence.

18. The apparatus of claim 15, further comprising:
a means for receiving, the means for receiving to down-convert and demodulate an optical signal to provide the first and second input sequences.

19. A non-transitory computer-readable memory to store instructions that when executed on a system cause the system to perform a process to filter a first input sequence to provide a filtered output, the filter associated with a set of filter tap coefficients, where the set of filter tap coefficients is represented by a set of distinct values, the process comprising:

storing a time window of the first input sequence;

summing for each distinct value an associated set of the time window of the first input sequence according to a mapping to provide a first plurality of sums, the mapping associating for each distinct value a set of the time window of the first input sequence, each sum in the first plurality of sums associated with a distinct value;

multiplying each sum in the first plurality of sums with its corresponding distinct value to provide a first plurality of products; and summing each product in the first plurality of products to provide a portion of the filtered output.

20. The non-transitory computer-readable memory of claim 19, wherein the summing for each distinct value an associated set of the time window of the first input sequence includes sign inverting a subset of the associated set of the time window of the first input sequence.

21. The non-transitory computer-readable memory of claim 19, wherein the first input sequence and a second input sequence comprise, respectively, in-phase and quadrature components of an input sequence, the filtered output comprising in-phase and quadrature components, wherein the summing each product in the first plurality of products provides the in-phase component of the filtered output, the process further comprising:

storing a time window of the second input sequence, wherein the mapping associates for each distinct value a set of the time window of the second input sequence;

summing for each distinct value an associated set of the time window of the second input sequence according to the mapping to provide a second plurality of sums, each sum in the second plurality of sums associated with a distinct value;

multiplying each sum in the second plurality of sums with its corresponding distinct value to provide a second plurality of products; and summing each product in the second plurality of products to provide the quadrature component of the filtered output.

22. The non-transitory computer-readable memory of claim 21, wherein the summing for each distinct value an associated set of the time window of the first input sequence includes sign inverting a subset of the associated set of the time window of the first input sequence; and the summing for each distinct value an associated set of the time window of the second input sequence includes sign inverting a subset of the associated set of the time window of the second input sequence.

* * * * *